United States Patent [19]
Grüning

[11] Patent Number: 4,952,990
[45] Date of Patent: Aug. 28, 1990

[54] GATE TURN-OFF POWER SEMICONDUCTOR COMPONENT

[75] Inventor: Horst Grüning, Baden, Switzerland

[73] Assignee: BBC Brown Boveri AG., Baden, Switzerland

[21] Appl. No.: 319,916

[22] Filed: Mar. 6, 1989

Related U.S. Application Data

[63] Continuation of Ser. No. 51,865, May 20, 1987, abandoned.

[30] Foreign Application Priority Data

Jun. 3, 1986 [CH] Switzerland .................. 2233/86

[51] Int. Cl.$^5$ ............................................. H01L 29/80
[52] U.S. Cl. ........................................ 357/22; 357/38; 357/56; 357/43; 357/34
[58] Field of Search ................. 357/23, 38, 55, 56, 357/43, 34

[56] References Cited

U.S. PATENT DOCUMENTS

| | | |
|---|---|---|
| 4,037,245 | 7/1977 | Ferro . |
| 4,476,622 | 10/1984 | Cogan . |
| 4,514,747 | 4/1985 | Miyata et al. ................... 357/38 |
| 4,571,815 | 2/1986 | Baliga et al. ................... 357/22 E |

FOREIGN PATENT DOCUMENTS

| | | |
|---|---|---|
| 0121068 | 10/1984 | European Pat. Off. ........... 0038248/101981EPX |
| 0178387 | 4/1986 | European Pat. Off. . |
| 57-172765 | 10/1982 | Japan . |
| 57-173974 | 3/1983 | Japan . |

OTHER PUBLICATIONS

Patents Abstracts of Japan, vol. 7, No. 13 (E-153)[22258 Jan. 19, 1983, & JP, A, 57172765 (Handoutai Kenkiyuu Shinkoukai) 23, Oktober 1982, siehe Zusammenfassung; FIG. 1.

Patents Abstracts of Japan, vol. 7, No. 136 (E-181)[1281] Jun. 14, 1983, & JP A, 5850775 (Mitsubishi Denki K.K.) 25, Marz 1983, siehe Zusammenfassung; Figuren 2, 4.

Patents Abstracts of Japan, vol. 7, No. 17 (E-154)[1162] Jan. 22, 1982, siehe Zusammenfassung; figuren 1,2.

*Primary Examiner*—Joseph E. Clawson
*Attorney, Agent, or Firm*—Oblon, Spivak, McClelland, Maier & Neustadt

[57] ABSTRACT

In a gate turn-off power semiconductor component in the form of a field-controlled thyristor (FCTh) with (14) separated from each other by trenches (10), means of control which make possible a constricton of the current-carrying channel over the entire depth of the cathode finger (14) and at the same time do not increase or do not substantially increase the ON resistance of the component are additionally provided in the region of the trench walls (9).

In an exemplary embodiment, a p-doped wall layers (4), which have a reduced doping concentration compared with the gate regions (8) on the trench floors are introduced into the trench walls (9) as means.

3 Claims, 2 Drawing Sheets

GATE TURN-OFF POWER SEMICONDUCTOR COMPONENT

This application is a continuation of application Ser. No. 051,865, filed on May 20, 1987, now abandoned.

BACKGROUND OF THE INVENTION

1. Field of the Invention:

The present invention relates o a gate turn-off semiconductor component in the form of a field-controlled thyristor. Such a component is described, for example, in EP-A2 0,178,387.

2. Discussion of the Background:

Field-controlled power semiconductor components are known with various structure and under various designations. Within this group of known components, a distinction is drawn essentially between two types of operation, namely unipolar structures such as, for example, field effect transistors of the MOSFET or JFET type which majority-carrier conduction and also components with bipolar carrier injection such as, for example, the field-controlled thyristor FCTh (*Field Controlled Thyristor*) or the static induction thyristor SITh (*Static Induction Thyristor*).

For physical reasons, the last named bipolar structures, whose operation is explained in the publication mentioned in the introduction, are particularly of interest for applications in the high-power range.

This mode of operation of the known structures is based as a rule on the application cf the JFET (*Junction Field Effect Transistor*) principle for the control: regions with charge-carrier depletion, which extend into the current-conducting channel region as the gate voltage increases, and finally interrupt or turn off the current flow by constricting the channel region, are produced in finely subdivided gate or control zones which alternate with cathode regions by applying an appropriate gate voltage and building up an expanding space charge region.

In the absence of a gate voltage, the field-controlled thyristor is in the conducting state (ON state) and is only turned off by applying a suitable gate voltage. For the dimensioning and design of such a thyristor structure this means that, in the conducting state, as low a conducting-state resistance (ON resistance) as possible is desirable in order to limit the drop in power across the component at maximum current flow. On the other hand, the gate-cathode structure of the component should be so designed that as good a controllability as possible is achieved, i.e. high powers can be switched with low gate voltages and gate currents.

On the basis of a structure of an FCTh known from EP-A1 0,121,068, in which the p-doped gate regions are disposed on the floors of the trenches, which separate the individual cathode fingers from each other, EP-A2 0,178,387 proposes to extend the p-doped gate regions to the trench walls in order thereby to achieve an improvement of the blocking gain and consequently of the controllability of the FCFh.

This extension of the gate regions to the trench walls achieves field control over the entire depth of the channel extending in the cathode finger. This ensures that the particular cathode finger is turned off with a sufficiently low gate voltage.

However, the improvement in the control properties achieved with the extended gate regions entails problems for the on-state behaviour of the thyristor: in the ON state the n-doped channel in the cathode finger is not flooded with charge carriers since the holes injected from the anode drain away via the p-doped gate regions in the trench walls. This chargecarrier depletion in the channel region results in a high ON resistance even though the gate electrode is not at a fixed potential ("floating gate").

SUMMARY OF THE INVENTION

Accordingly, one object of this invention is to provide a novel field-controlled thyristor which has the finely subdivided gate-cathode structure and which has an improved control capability without affecting the conducting state properties unfavorably.

The object is achieved in a gate turn-off power semiconductor component of the type mentioned in the introduction by providing additionally in the region of the trench walls, means of control which are so constructed that the ON resistance is not increased or not substantially increased.

In detail three different exemplary embodiments, are provided for said means.

The first exemplary embodiment comprises wall layers in the trench walls which have a markedly lower p-doping than the actual gate regions.

The second exemplary embodiment comprises, in the region of the trench walls, a field-effect control according to the MOSFET principle with insulation layers deposited on the trench walls over which the extended gate contact extends.

The third exemplary embodiment provides, in the region of the trench walls, an NPN transistor structure which consists of the n-doped channel region, p-doped wall layers introduced into the trench walls and n-doped cathode regions extended to the trench walls and introduced into the wall layers.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
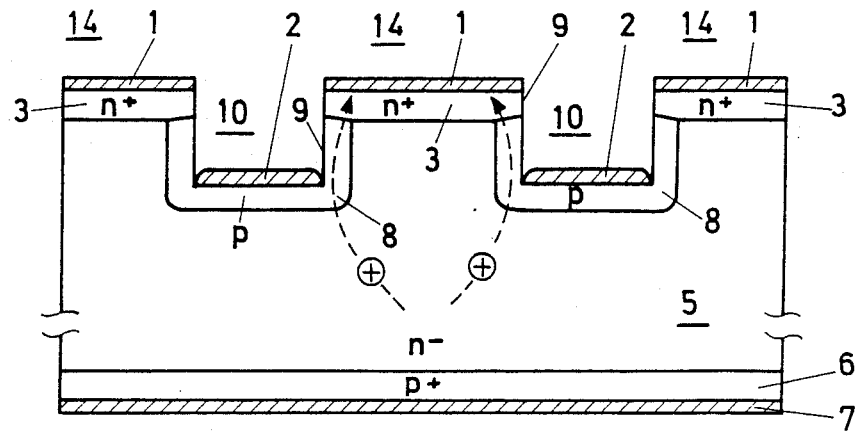
FIG. 1 shows the cutaway portion of a known FCTh structure with gate regions extended onto the trench walls in cross-section.

Referring now to the drawings, wherein like reference numerals designate identical or corresponding parts throughout the several views.

In FIG. 1 the structure of the FCTh known from EP-A1 0,178,387 is shown in cross-section as a cutaway section.

Between a metallic anode contact 7 on the anode side and metallic cathode contacts 1 on the cathode side there is disposed a sequence of various y doped layers which comprises a p+-doped anode layer 6, an n−-doped channel layer 5 and n+-doped cathode regions 3.

The individual cathode regions 3 are separated from each other by deep narrow trenches 10 and form individual narrow cathode fingers 14 to!ether with the respective regions of the channel layer 5 situated below them. p-doped gate regions 8 have been introduced into the floors of the trenches 10 and into he trench walls 9, and provided with metallic gate contacts 2 in the region of the trench floors.

If a negative gate voltage is now applied to the gate contacts 2, a space charge region, which, with increasing gate voltage, extends into the channel region present in the cathode fingers 14 and empties the region of charge carriers, forms at the PN-junction between gate region 8 and channel layer 5. Since this control effect becomes effective virtually over the entire depth of the cathode finger as a result of the gate regions 8 extended onto the trench walls 9, especially advantageous control properties are achieved by this known structure.

In the ON state of the component, however, the extended gate regions 8 become noticeable in a disadvantageous manner. As indicated by the broken arrows in FIG. 1, the channel in the cathode finger 14 is not flooded in the ON state with freely mobile charge carriers, in this case holes, because said holes (represented in FIG. 1 by the circles provided with "+" signs) which are injected from the anode layer 6 into the channel layer 5 drain away in the direction of the arrows via the extended p-doped gate regions 8 in the trench walls 9 to the cathode side. However, since the channel region is not flooded with charge carriers, it has a relatively high resistance which becomes noticeable as an increased ON resistance of the component.

Figure 2:
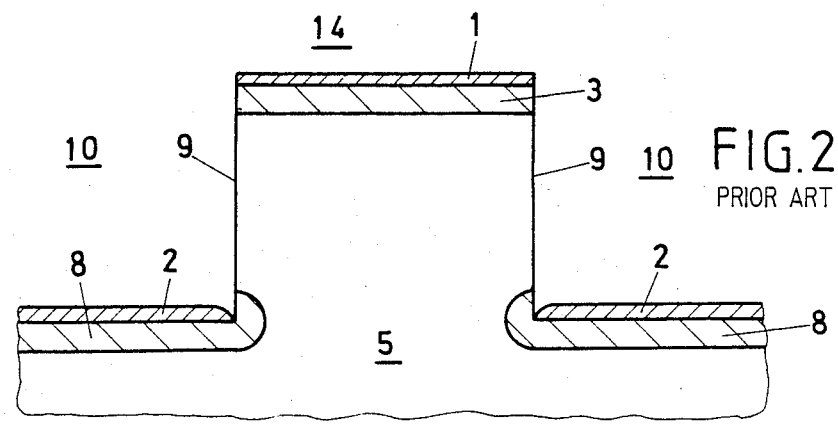
FIG. 2 shows the cross-section through a cathode finger of a known FCTh structure without additional control means in the region of the trench walls.

The present invention is therefore based on a gate-cathode configuration as is represented in a cutaway manner for a cathode finger 14 in FIG. 2 and is known from EP-A1 0,121,068. Here the (ate regions 8 are essentially confined to the floors of the trenches 10.

In the region of the trench walls 9 there are additionally provided, according to the invention, means of control which, in contrast to the known solution with the extended gate regions, dc not increase or do not substantially increase the ON resistance of the component.

Figure 3A:
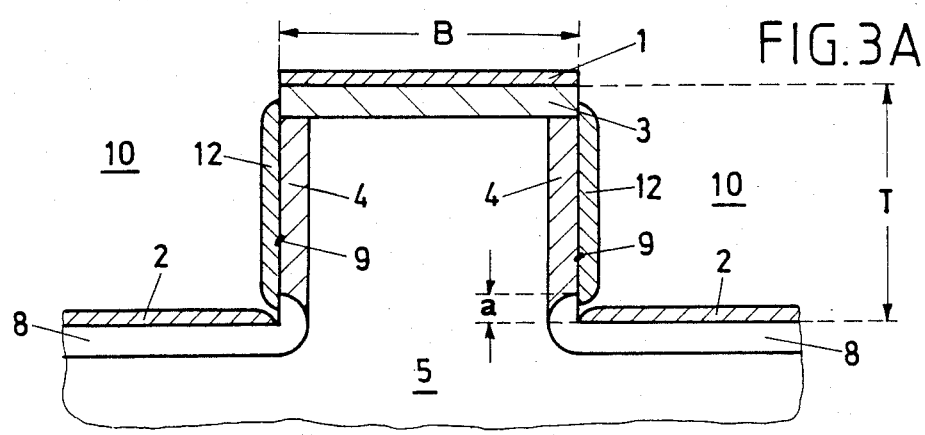
FIG. 3A shows the cross-section through a cathode finger with additional control means in the region of the trench walls according to a first exemplary embodiment of the invention.

A first exemplary embodiment for the development of the additional means according to the invention is shown in FIG. 3A. In this exemplary embodiment, wall layers 4 which extend from the gate regions 8 to the cathode region 3 are introduced (diffused) into the trench walls 9.

The wall layers 4 are p-doped like the gate regions 8. In contrast to the known solution from FIG. 1, however, the two p-dopings are not equal in their concentration but varied stepwise, the wall layers 4 having a markedly lower doping concentration than the gate regions 8.

This stepwise variation in the doping concentration has the result that considerably fewer holes are drawn off from the channel region of the cathode finger 14 and drained away via the wall layers 4 to the cathode.

A comparable effect can also be achieved if, instead of the stepwise variation of the doping concentration, the wall layers 4 are reduced in their thickness. In this case, too, the resistance of the wall layers 4 along the trench walls 9 is increased so that the ON resistance of the component is not substantially increased by charge carriers being drawn off from the channel region.

To improve the conducting-state properties in the embodiment of FIG. 3A, two parameters are accordingly available which may be chosen independently of each other in a suitable manner: the thickness of the wall layer 4 and its doping concentration.

In order to make the invention clearer, a dimensioning example may be provided below which relates to a stepwise variation of doping concentration:

| | |
|---|---|
| Finger width B: | 30 μm |
| Trench depth T: | 35 μm |
| Thickness of the cathode region 3: | 4 μm |
| Thickness of the wall layers 4: | 4 μm |
| Overhang a of the gate regions 8: | 10 μm |
| Edge doping concentration in the gate regions 8: | $4 \times 10^{16}$ cm$^{-3}$ |
| Edge doping concentration in the wall layers 4: | $3 \times 10^{15}$ cm$^{-3}$ |

A general requirement for the dimensioning of the wall layers 4 may be defined in the following manner:

The thickness and doping concentration of the wall layers 4 must be so chosen that (a) at maximum load, i.e. at maximum current in the conducting state, less than ⅓ of the hole current which reaches the cathode finger i drained away via the wall layers 4 to the cathode, and (b) at the electric field which occurs as a maximum, the wall layers 4 are still not completely depleted of charge carriers, i.e. the space charge region of the PN junction between wall layer 4 and channel layer 5 still fails to reach the trench walls 9.

As regards the gate regions 8, the dimensioning may be adopted from the already known prior art.

In the exemplary embodiment of FIG. 3A, the trench walls 9 must be metal-free in order not to shortcircuit the intended high resistance of the wall layers 4 and thus thwart the success aimed at.

Nevertheless, if the metallization of the gate contacts 2 should be restricted not only to the trench floors (as shown in FIG. 3A) for technological reasons during the manufacture of the component but should also extend over the side walls, it is essential to protect the wall layers 4 from a short circuit by wall coating layers 12 of insulating material, for example $SiO_2$, deposited on the trench walls 9.

Figure 3B:
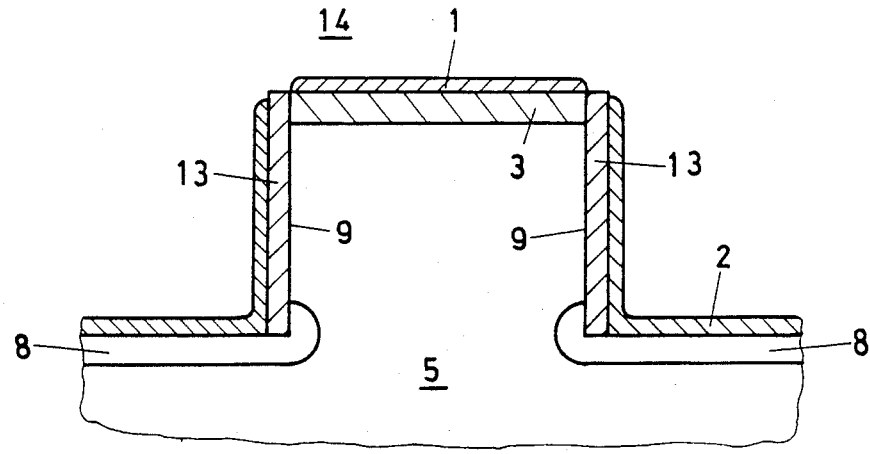
FIG. 3B shows a cross-section corresponding to FIG. 3A according to a second exemplary embodiment of the invention and FIG. 3C shows a cross-section corresponding to FIG. 3A according to a third exemplary embodiment of the invention.

A second exemplary embodiment for the invention is shown in FIG. 3B. In this exemplary embodiment, no wall layers are provided in the cathode finger 14. On the other hand, the improvement of the control properties is achieved by a MOSFET arrangement consisting of an insulation layer 13 and an extension of the gate contact 2 situated on top of it in the region of the trench walls 9.

The insulation layer 13, which consists, for example, of a 0.2 μm thick $SiO_2$ layer, is preferably produced on the trench walls 9 by oxidation. The extension of the gate contact 2, which is present, for example, in the form of an aluminium layer and is situated on top of it acts as a metal electrode.

The mode of operation of this arrangement is the following: in the conducting state the cathode finger 14 behaves like the conventional configuration shown in FIG. 2 because of the insulating properties of the insulation layers 13. The flood of holes is not drawn off from the channel region.

On turning off by means of the gate, the charge carriers are drawn off from the channel layer 5 via the gate regions 8 in the known manner, the p-doped gate regions 8 diffused into the n-doped channel layer 5 acting as a junction FET.

In addition to this traditional control mechanism, a field-effect control now occurs, as a result of the MOSFET arrangement, on the trench walls 9 and has the effect that the channel is constricted on turn off not only at the height of the gate regions 8, but over the entire depth of the cathode finger 14. An improved control is therefore achieved with the MOSFET arrangement according to FIG. 3B without impairing the properties in the conducting state.

In addition, the conducting-state properties can be improved even further if the surface recombination of the charge carriers flooding the cathode finger 14 at the trench walls 9 is reduced by an oxidation which is low in surface states during the manufacture of the insulation layers.

Figure 3C:
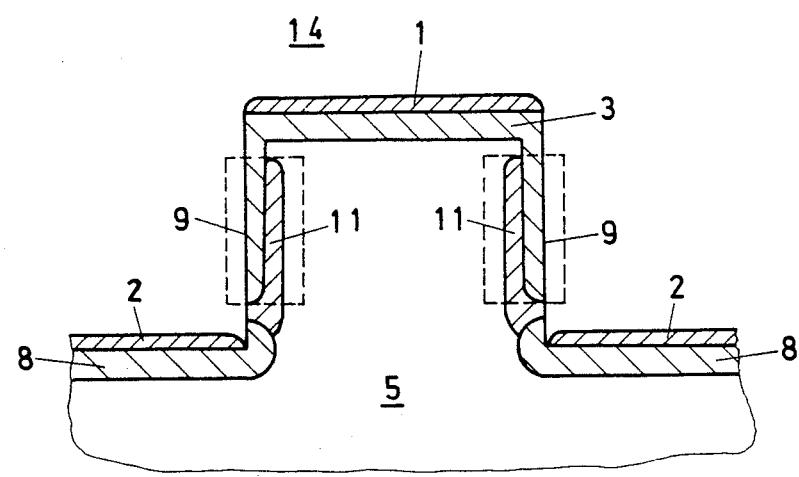

A third exemplary embodiment for the novel power semiconductor component is shown in FIG. 3C. In this exemplary embodiment, planar NPN transistors, which are formed by the n-doped channel layer 5, p-doped wall layers 11 and extensions of the n-doped cathode region 3 brought down the trench walls 9, are disposed in the regions of the trench walls 9 to improve the control properties. The NPN transistors are made recognizable in FIG. 3C by the frames drawn in broken lines.

In the lower part of the cathode finger 14, the wall layers 11 are directly adjacent to the gate regions 8 and thus form a continuation of the gate regions corresponding to the exemplary embodiment of FIG. 3A so that the constriction of the channel region on turnoff again takes place over almost the entire depth of the cathode finger 14.

The extended cathode region 3 is introduced into the wall layers 11, but does not, however, reach the gate regions 8 but is separated from them by a piece of the wall layers 11.

In the conducting state, the NPN transistor described is turned on at fairly high on-state currents. As a result of the transistors in the trench walls 9 turning on, the on-state current flows via the sides of the cathode finger 14 to the cathode. In this way, the channel in the cathode finger 14 is short-circuited or the current-carrying part of the channel is considerably shortened, as a result of which a lower resistance is produced.

When the component is turned off, the transistors are also switched off so that the all layers 11 are then alloted the function already described in constricting the channel.

Because of the similar mode of operation, the same rules apply in principle to the dimensioning of the wall layers 11 as for the wall layers 4 of the exemplary embodiment in FIG. 3A.

Altogether the invention yields a gate turnoff power semiconductor component which is notable for a low ON resistance with good control properties and which can be produced comparatively simply.

What is claimed as new and desired to be secured by Letters Patent of the United States is:

1. Gate turn-off power device of the PCTh (*Field Control-led Thyristor*) type, comprising:
    a cathode and an anode;
    a p-type anode layer;
    an n-type channel layer situated on top of said anode layer;
    a plurality of n-type cathode regions and p-type gate regions in an alternating manner on the side of said cathode, said cathode regions being disposed on cathode fingers separated from each other by trenches each having a bottom and sidewalls, said gate regions extending over the bottoms of said trenches;
    p-type wall layers introduced into the sidewalls of said trenches;
    said wall layers extending from said gate regions along said sidewalls toward said cathode;
    said cathode regions extending from the tops of said cathode fingers, overlapping portions of said wall layers along said sidewalls and being separated from said gate regions by non-overlapped portions of said wall layers which contact said gate region; and
    the overlapped portions of said cathode regions and said wall layers, and the regions of said channel layer located adjacent to said overlapped portions forming a three-layer NPN sequence extending over each of said sidewalls.

2. Gate turn-off device according to claim 1, wherein the doping concentration of said wall layers is less than the doping concentration of said gate regions.

3. Gate turn-off power device of the FCTh (*Field-Controlled Thyristor*) type, comprising:
    a cathode and an anode;
    a p-type anode layer;
    an n-type channel layer situated on top of said anode layer;
    a plurality of n-type cathode regions and p-type gate regions disposed in an alternating manner on the side of said cathode, said cathode regions being disposed on cathode fingers separated from each other by trenches each having a bottom and sidewalls, said gate regions extending over the bottom of said trenches; and
    p-type wall layers introduced into the sidewalls of said trenches, said wall layers extending from said cathode regions to the adjacent of said gate regions;
    said wall layers having at least a selected one of a doping concentration lower than the doping concentration of said gate region and a smaller thickness than the gate region so that the ON resistance of the device in the conducting state is not substantially increased;
    wherein the wall layers are dimensioned such that
    (a) at maximum power less than $\frac{1}{3}$ of the hole current arriving in the cathode fingers is drained away via the wall layers to the cathode of the component, and
    (b) the charge carriers are not yet completely depleted from the wall layers at the maximum electric field which occurs.

* * * * *